United States Patent [19]

Miyaoka et al.

[11] Patent Number: 4,984,058
[45] Date of Patent: Jan. 8, 1991

[54] SEMICONDUCTOR INTEGRATED CIRCUIT DEVICE

[75] Inventors: Shuuichi Miyaoka; Nobuo Tamba, both of Ohme; Toshikazu Arai, Maebashi; Hiroshi Higuchi, Takasaki; Hisayuki Higuchi, Kokubunji, all of Japan

[73] Assignees: Hitachi Microcomputer Engineering, Ltd.; Hitachi, Ltd., both of Tokyo; Akita Electronics Co., Ltd., Akita, all of Japan

[21] Appl. No.: 225,357

[22] Filed: Jul. 28, 1988

[30] Foreign Application Priority Data

Jul. 30, 1987 [JP] Japan .................. 62-190974

[51] Int. Cl.$^5$ ............................................. H01L 23/48
[52] U.S. Cl. .......................................... 357/68; 357/71; 357/40; 357/45
[58] Field of Search ....................... 357/68, 71, 40, 45, 357/41, 43, 23.6

[56] References Cited

U.S. PATENT DOCUMENTS 4,499,484 2/1985 Tanizawa et al. ............... 357/45
4,825,276 4/1989 Kobayashi ....................... 357/40

FOREIGN PATENT DOCUMENTS 58-199557 11/1983 Japan .
62-81743 4/1987 Japan ............................... 357/40

Primary Examiner—Andrew J. James
Assistant Examiner—Mark Prenty
Attorney, Agent, or Firm—Antonelli, Terry, Stout & Kraus

[57] ABSTRACT

In a semiconductor integrated circuit device having memory cell arrays, power source wirings are provided on the memory cell array in parallel with the long side of the memory cell array, thereby strengthening the power source wirings without increasing a chip size and planning reduction in power source impedances.

19 Claims, 4 Drawing Sheets

SEMICONDUCTOR INTEGRATED CIRCUIT DEVICE

BACKGROUND OF THE INVENTION

The present invention relates to a semiconductor integrated circuit device, and particularly to an effective technology in connection with a semiconductor integrated circuit device having memory cell arrays.

Until now, power source wirings in a dynamic RAM (Random Access Memory) and static RAM using two-layer aluminum wirings have been provided only along an outer periphery of a memory cell array, and wirings for data lines and strengthening word lines which comprise aluminum wirings of the first layer and the second layer respectively are only provided in the region of the memory cell array. (For example, see Japanese Patent Laid-open No. 199557/1983)

SUMMARY OF THE INVENTION

As a result of the inventors having carefully investigated and studied this area of technological subject matter, they have determined that certain problems are associated therewith, including with respect to that described above. In other words, since the above-mentioned power source wiring is made longer along with any increase of the memory cell arrays, such as, resulting from high integration, its wiring resistance is consequently increased. In order to reduce the wiring resistance, it is necessary to increase the width of the power source wiring. This means that the chip size must also be increased. However, as the length of the short side of the rectangular chip is particularly restricted by the size of a package used, the width of the power source wiring is more apt to decrease together with an increase in the capacity of the memory cell arrays. Accordingly, there is a problem that this would introduce an increase of the power source impedance and consequently would cause a reduction in operation the margin of the circuit and thereby a reduction in the operation speed.

It is an object of the present invention to provide a technology by which the power source impedance can be reduced without increasing the chip size.

The above-mentioned object, the other objects, and new features of the present invention will be clarified by the description of the present specification and accompanying drawings.

A brief discussion of a typical aspect among those pertaining to the invention disclosed in the present application is briefly described, as follows.

The power source wiring according to one aspect is provided on the memory cell array. Since the power source wiring is provided on the memory cell array according to the above-mentioned means, the power source wiring can be strengthened without increasing the chip size. Accordingly, the power source impedance can be reduced without increasing the chip size.

DESCRIPTION OF THE PREFERRED EMBODIMENT

Figure 1:
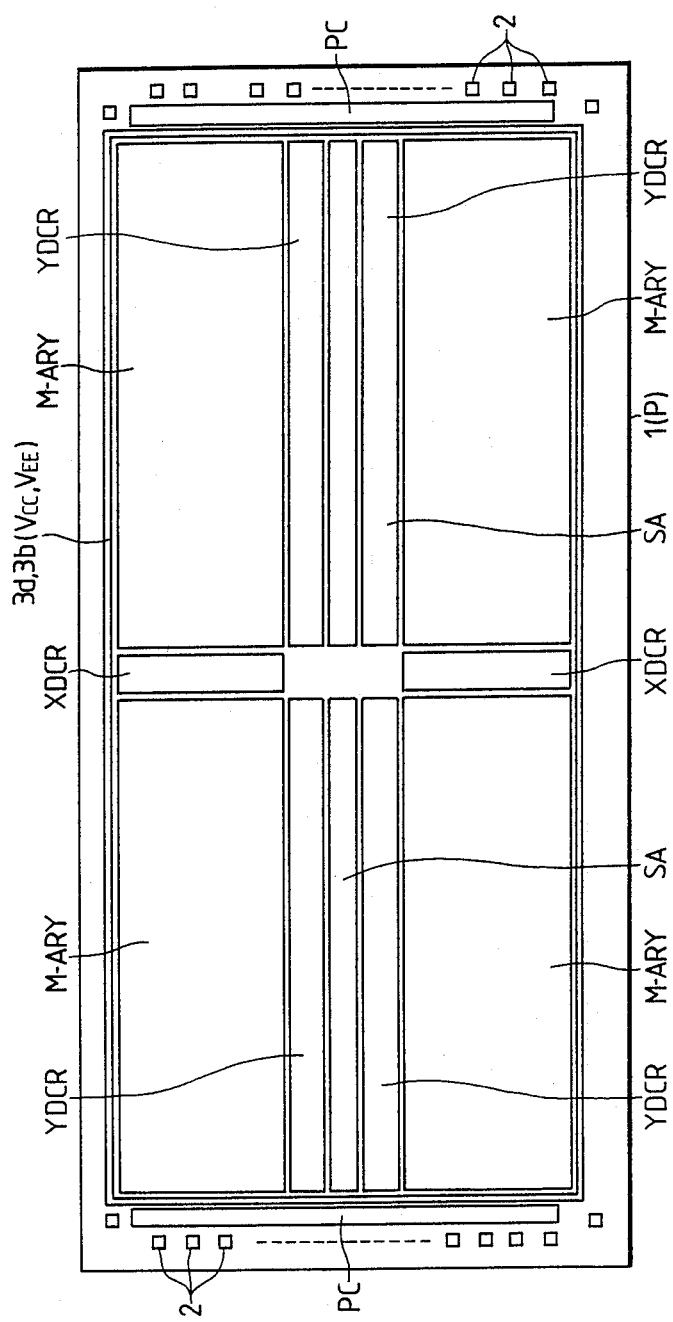
FIG. 1 is a plan view showing a whole structure of a static RAM of an embodiment according to the present invention.
Figure 2:
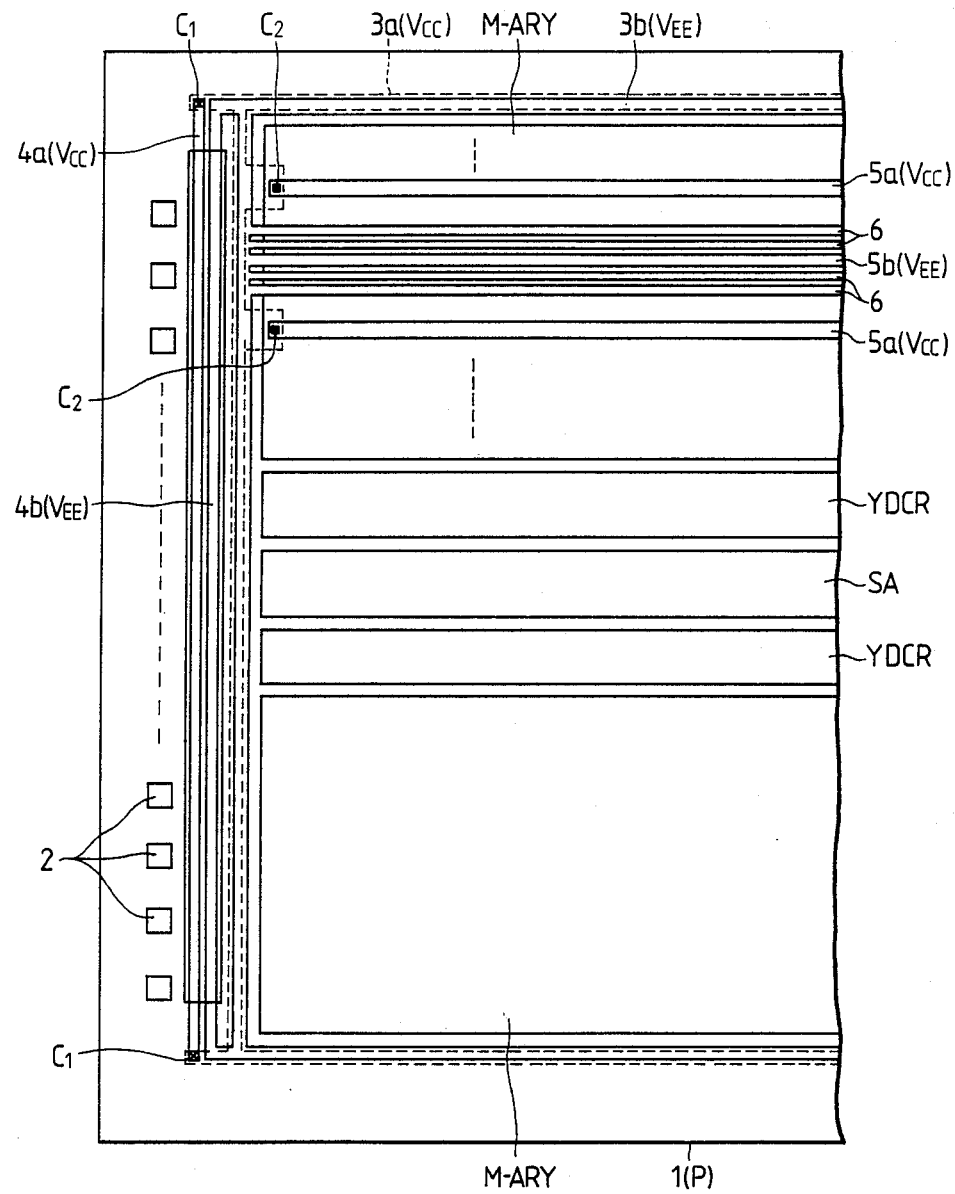
FIG. 2 is an enlarged plan view of an important part of the static RAM shown in FIG. 1.

FIG. 1 is a plan view showing a whole structure of a static RAM of an embodiment according to the present invention. FIG. 2 is an enlarged plan view of an important part of the static RAM shown in FIG. 1. Incidentally, the static RAM is, for example, one using a bipolar-CMOS LSI.

As shown in FIGS. 1 and 2, the static RAM according to the present invention has, for example, such a semiconductor chip 1 as a rectangular-shaped p-type silicon chip, on which, for example, four memory cell arrays M-ARYs, X decoders (row address decoders) XDCRs, Y decoders (column address decoders) YDCRs, a sense amplifier SA, peripheral circuits PC, pads 2, and the like are provided. Marks 3a and 3b are a 1st power source wiring Vcc for supplying O(volts) and a second power source wiring $V_{EE}$ for supplying $-5.2$ (volts), respectively. Among them, the power source wiring 3a is composed of, for example, an aluminum film in the first layer, and the power source wiring 3b is composed of, for example, an aluminum film in the second layer.

The widths of these power source wirings 3a and 3b are both, for example, about 70 $\mu$m.

Incidentally, marks 4a and 4b are the 1st power source wiring Vcc and the second power source wiring $V_{EE}$ for the peripheral circuits PC, respectively. Both wirings are composed of, for example, an aluminum film in the second layer. The power source wiring 4a is connected to the power source wiring 3a through a contact hole $C_1$, and the power source wiring 4b is directly connected to the power source wiring 3b.

In the present embodiment, power source wirings 5a and 5b extending in the direction parallel with a long side of the semiconductor chip 1 and wirings 6 for strengthening word lines WL described later are provided on the memory cell array M-ARY. Any one of these power source wirings 5a and 5b and the wirings 6 for strengthening is composed of, for example, an aluminum film in the second layer. In this case, the wirings 6 for strengthening the word lines are connected to the peripheral circuits PC, the power source wiring 5a is connected through contact holes $C_2$ to the power source wiring 3a, and the power source wiring 5b is directly connected to the power source wiring 3b. The numbers and the widths of these power source wirings 5a and 5b are selected in such a manner that a potential drop at the time when a current of, for example, 100 mA is flowing through the whole of the these power source wirings 5a and 5b and the power source wirings 3a and 3b is made not more than 100 mV (it corresponds to a wiring resistance not more than 1 $\Omega$). In order to satisfy this condition, the sum of the widths of the respective power source wirings of these power source wirings 5a and 5b and the power source wirings 3a and 3b (the width of the whole) should be, for example, not less than 300 $\mu$m. In this case, for example, the respective 16 power source wirings 5a and 5b are provided for two memory arrays M-ARYs in the direction of the long side of the semiconductor chip 1, for example, wherein each one of the power source wirings 5a and 5b is provided for eight memory cells arranged in the direction of the short side of the semiconductor chip 1, and at the same time, the widths of the power source wirings 5a and 5b can be made to be, for example, 15 μm and 7 μm, respectively.

Since the power source wirings 5a and 5b are provided in addition to the power source wirings 3a and 3b in this way, the power source wiring as a whole can be strengthened. Since the resistance of the power source wiring as a whole can be reduced to, for example, $\frac{1}{3} \sim \frac{1}{4}$ times or so that of the conventional power source wiring by this, the power source impedance can be remarkably reduced. Moreover, since the power source wirings 5a and 5b are provided on the memory cell array M-ARY, the chip size is not increased at all. In other words, a substantial reduction in the power source impedance can be realized without increasing the chip size. Since a drop of the power source potential due to the wiring resistance of the power source wiring as a whole can be substantially suppressed, for example, limited to not more than 100 mV as described above, improvement in the operation margin of the circuit can be realized. Similarly, since a potential drop in the AC noise term can be reduced, improvement in the operation speed can be realized. Furthermore, since the entire width of the power source wirings can be enhanced, compared with that of the conventional power source windings provided only along the memory cell array, the capacitance between the power sources is increased, thereby allowing reduction in switching noise associated with the circuits to be realized.

Figure 3:
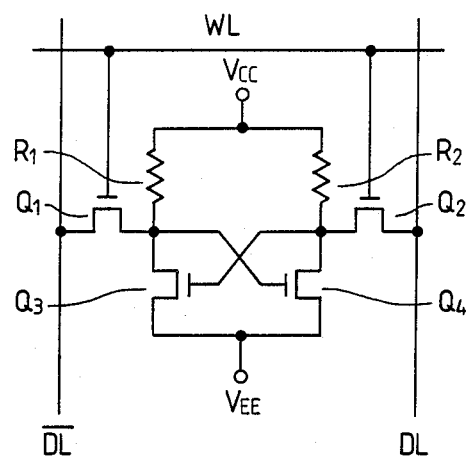
FIG. 3 is a circuit diagram showing an equivalent circuit of a memory cell of a high resistive load type in the static RAM shown in FIG. 1.

FIG. 3 is a circuit diagram showing an equivalent circuit of a high resistive load type memory cell of the static RAM shown in FIG. 1.

As shown in FIG. 3, memory cells of the SRAM are provided at crossing portions between a pair of complementary data lines of DL, $\overline{DL}$ and the word line WL.

The memory cell is composed of a flip-flop circuit and transfer MISFETs $Q_1$ and $Q_2$ connected between a pair of input and output terminals of the flip-flop circuit and the data line DL. The word line WL is connected to gates of the MISFETs $Q_1$ and $Q_2$. The flip-flop circuit comprises an inverter circuit composed of a high resistive load element $R_1$ and a driving MISFET $Q_3$ and an inverter circuit composed of a high resistive load element $R_2$ and a driving MISFET $Q_4$. Input and output terminals of one inverter circuit are respectively connected to output and input terminal of the other inverter circuit, respectively. A high resistive load element R has its one end portion connected to the power source voltage Vcc and its another end portion connected to the drain region of the corresponding driving MISFET. The source of each driving MISFET is connected to the earth potential $V_{EE}$.

Figure 4:
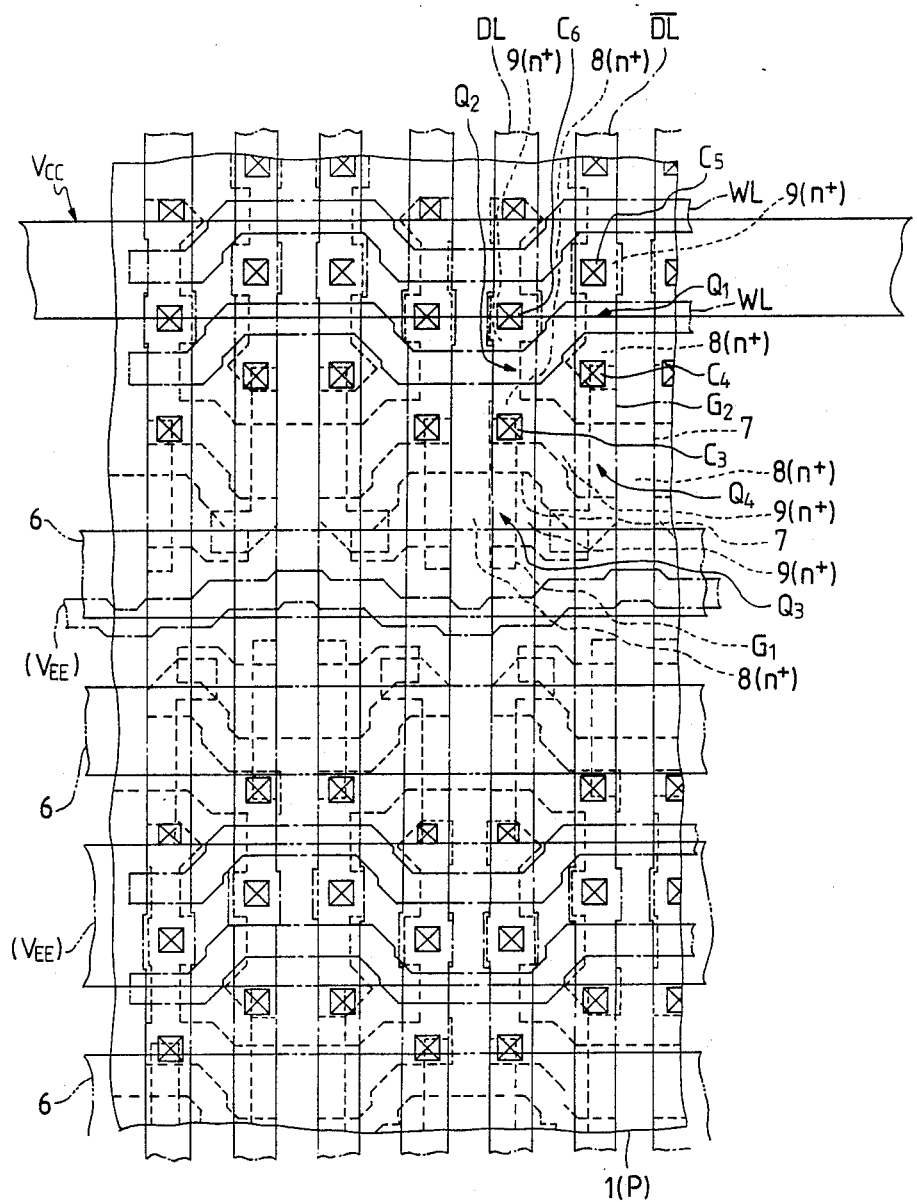
FIG. 4 is an enlarged plan view of an important part of the memory cell array of the static RAM shown in FIG. 1.

An enlarged plan view of an important part of a memory cell array of the static RAM shown in FIG. 1 is shown in FIG. 4.

As shown in FIG. 4, the static RAM according to the present embodiment has such a field insulating film 7 as, for example, an $SiO_2$ film provided on the surface of a p-type semiconductor printed-board made of single-crystal silicon, thereby separating elements such as a MISFET and the like. On a surface of an active region surrounded by the field insulating film 7, a gate insulating film (not shown in the figure), for example, such as an $SiO_2$ film is provided. On the insulating film and the field insulating film 7, gate electrodes $G_1$ and $G_2$ of the MISFETs $Q_3$ and $Q_4$ composed of, for example, a polycrystal silicon film in the first layer and the word line WL are provided. Each one end of these gate electrodes $G_1$ and $G_2$ is directly connected to a source region 8 of n-channel MISFETs $Q_1$ and $Q_2$ described later through each of contact holes $C_3$ and $C_4$ formed on the gate insulating film, thereby realizing cross-linking of the flip-flop circuits of the memory cell. Incidentally, these gate electrodes $G_1$ and $G_2$ and the word line WL may be composed of a single layer metal film having a high melting point, a silicide film of metal having a high melting point, a polycide film obtained by providing a silicide film of metal having a high melting point on a polycrystalline silicon film, or the like.

In the semiconductor substrate 1, for example, a n-type source region 8 and drain region 9 are provided by using self-alignment for the gate electrodes $G_1$ and $G_2$ and the word line WL. The n-channel MISFETs $Q_1$ and $Q_2$ are composed of the word line WL, the source region 8, and the drain region 9. Also, the n-channel MISFET $Q_3$ is composed of the gate electrode $G_1$, the source region 8, and the drain region 9, and the n-channel MISFET $Q_4$ is composed of the gate electrode $G_2$, the source region 8, and the drain region 9.

So as to cover the MISFETs $Q_1$, $Q_2$, $Q_3$, and $Q_4$, an interlayer insulating film composed of, for example, a silicon oxide film and, for example, a PSG film (omitted in the figure) is provided on the whole surface of the semiconductor substrate 1. On the interlayer insulating film, high resistive load elements $R_1$ and $R_2$ and the wiring 10 for the power source voltage are formed from, for example, a polycrystalline film in the second layer.

The high resistive load element R is connected to the predetermined gate electrode and semiconductor region through a connecting hole (not shown in the figure) formed in the interlayer insulating film. The data lines DL and $\overline{DL}$ composed of, for example, an aluminum film in the first layer are formed through an insulating film composed of, for example, a silicon oxide film formed on the whole surface of the semiconductor substrate 1 so as to cover the load elements $R_1$ and $R_2$. These data lines DL and $\overline{DL}$ are connected to the drain regions 9 of the n-channel MISFETs $Q_1$ and $Q_2$ through connecting holes $C_5$ and $C_6$ provided in the insulating film. The power source wirings 5a(Vcc) and 5b (Vee) and the wiring 6 for strengthening are extended in the direction perpendicular to the data line with the interlayer insulating film (not shown in the figure) made to lie therebetween. The power source wirings 5a (Vcc) and 5b (Vee) and the wiring 6 for strengthening are formed from, for example, an aluminum film in the second layer.

Though the present invention has been described concretely in conjunction with an exemplifying embodiment, the present invention is not to be considered as being limited to the above-mentioned embodiment, but that various changes thereof may, of course, be made without departing from the spirit and scope of the invention, and that the present invention may also be depicted in connection with alternative embodiments.

For example, portions of the power source wirings 3a and 3b which are in parallel with the long side of the semiconductor chip 1 can be removed as required. If the wiring 6 for strengthening the word line WL is provided one by one such that each one is associated with two memory cells in the direction of the short side of the chip by devising a decoding method, the number of respective wirings 6 for strengthening can be reduced. Accordingly, the widths of the power source wirings 5a and 5b can as a result thereof be increased correspondingly. Furthermore, the present invention is applicable to various kinds of semiconductor circuit devices having memory cell arrays.

A typical advantageous effect obtained by a semiconductor device according to the present invention, as disclosed in the present application, that is reduction in the power source impedance can be implemented without increasing the chip size.

What is claimed is:

1. A semiconductor integrated circuit device comprising:
    a semiconductor chip having a main surface;
    a plurality of memory cells arranged along row and column directions on said main surface thereby forming rows and columns of memory cells, each of the memory cells being connected to corresponding word and data lines which extend in said column and row directions, respectively;
    a first wiring extending in said column direction for supplying a first potential to memory cells which are arranged in said column direction; and
    a second wiring extending in said column direction over said plurality of memory cells and comprising a different layer as that of said first wiring, said second wiring being applied with said first potential.

2. A semiconductor integrated circuit device according to claim 1, wherein said second wiring comprises an aluminum film.

3. A semiconductor integrated circuit device according to claim 2, wherein said data line comprises an aluminum film.

4. A semiconductor integrated circuit device according to claim 2, wherein said first wiring comprises a polycrystalline silicon film.

5. A semiconductor integrated circuit device according to claim 4, wherein each of said plurality of memory cells includes two driving transistors, two transfer transistors and two load elements.

6. A semiconductor integrated circuit device according to claim 5, wherein said two load elements are formed from said polycrystalline silicon film.

7. A semiconductor integrated circuit device according to claim 1, wherein said plurality of memory cells arranged in row and column directions compose a memory cell array, and said second wiring is connected to a power source wiring extending in said row direction at a portion out of the memory cell array.

8. A semiconductor integrated circuit device according to claim 7, wherein each of said power source wiring and second wiring comprises an aluminum film.

9. A semiconductor integrated circuit device comprising a semiconductor chip having a main surface;
    a plurality of memory cells arranged along row and column directions on said main surface thereby forming rows and columns of memory cells, each of one of said memory cells being connected to corresponding word and data lines which extend in said column and row directions, respectively, and each one of said memory cells including two driving transistors, two transfer transistors and two load elements;
    a first wiring extending in said column direction for supplying a first potential to memory cells arranged in said column direction, and said first wiring being connected to the two load elements of memory cells of respective columns of memory cells,
    a further word line extending in said column direction and connected to said word line; and
    a second wiring extending in said column direction over said plurality of memory cells and comprising a different layer as that of said first wiring, said second wiring being applied with said first potential.

10. A semiconductor integrated circuit device according to claim 9, wherein said further word line and second wiring comprise a same layer of aluminum film.

11. A semiconductor integrated circuit device according to claim 10, wherein said further word line and second wiring extend in a parallel direction.

12. A semiconductor integrated circuit device according to claim 11, wherein said first wiring and said two load elements of each memory cell comprise a polycrystalline silicon film.

13. A semiconductor integrated circuit device according to claim 12, wherein one of said further word line and second wiring is formed over said first wiring.

14. A semiconductor integrated circuit device according to claim 13, wherein in each memory cell each one of said two driving transistors is series-connected with a respective one of said two load elements such that in each memory cell there is formed a flip-flop arrangement having a pair of logic inverters each one having inputs and outputs regeneratively cross-coupled and wherein each transfer transistor couples the output of one inverter and the input of the other of said pair of inverters in each memory cell to a corresponding data line.

15. A semiconductor integrated circuit device according to claim 14, wherein said chip is of an elongated rectangular shape having an outer periphery with a pair of short sides and a pair of long sides, and wherein said row and column directions extend in a direction parallel to the short and long sides of said chip, respectively.

16. A semiconductor integrated circuit device according to claim 9, wherein in each memory cell each one of said two driving transistors is series-connected with a respective one of said two load elements such that in each memory cell there is formed a flip-flop arrangement having a pair of logic inverters each one having inputs and outputs regeneratively cross-coupled and wherein each transfer transistor couples the output of one inverter and the input of the other of said pair of inverters in each memory cell to a corresponding data line.

17. A semiconductor integrated circuit device according to claim 16, wherein said chip is of an elongated rectangular shape having an outer periphery with a pair of short sides and a pair of long sides, and wherein said row and column directions extend in a direction parallel to the short and long sides of said chip, respectively.

18. A semiconductor integrated circuit device according to claim 5, wherein in each memory cell each one of said two driving transistors is series-connected with a respective one of said two load elements such that in each memory cell there is formed a flip-flop arrangement having a pair of logic inverters each one having inputs and outputs regeneratively cross-coupled and wherein each transfer transistor couples the output of one inverter and the input of the other of said pair of inverters in each memory cell to a corresponding data line.

19. A semiconductor integrated circuit device according to claim 18, wherein said chip is of an elongated rectangular shape having an outer periphery with a pair of short sides and a pair of long sides, and wherein said row and column directions extend in a direction parallel to the short and long sides of said chip, respectively.

* * * * *